United States Patent [19]

Fox

[11] 4,408,131

[45] Oct. 4, 1983

[54] OPTICALLY ISOLATED SOLID STATE RELAY

[75] Inventor: David A. Fox, Shawnee Township, Allen County, Ohio

[73] Assignee: Westinghouse Electric Corp., Pittsburgh, Pa.

[21] Appl. No.: 303,811

[22] Filed: Sep. 21, 1981

[51] Int. Cl.³ .................. H03K 3/42; H03K 19/42
[52] U.S. Cl. ................................. 307/311; 307/498; 307/571; 307/580; 307/471
[58] Field of Search ............... 307/311, 471, 498, 475, 307/571, 580

[56] References Cited

U.S. PATENT DOCUMENTS

| | | | |
|---|---|---|---|
| 3,963,947 | 6/1976 | Bogel | 307/598 |
| 4,188,547 | 2/1980 | Fox | 307/471 |
| 4,227,098 | 10/1980 | Brown et al. | 307/311 |

Primary Examiner—Stanley D. Miller
Assistant Examiner—B. P. Davis
Attorney, Agent, or Firm—R. P. Lenart

[57] ABSTRACT

A solid state relay is provided with a control logic circuit which receives a low level input control signal and controls a power field effect transistor (FET) switching element by means of an optical isolator. Connecting an external power source to a function selecting input terminal causes the relay to operate as a normally open, normally closed, or latching relay. A voltage spike suppression network protects the FET from voltage spikes appearing across it.

8 Claims, 2 Drawing Figures

OPTICALLY ISOLATED SOLID STATE RELAY

BACKGROUND OF THE INVENTION

This invention relates to solid state electronic relays and more particularly to such relays utilizing photovoltaic isolators and field effect power transistors.

Solid state relays are well known for use in electrical power systems to control the energization of a load by a power source. In direct current systems, the switching element of a solid state relay usually takes the form of a transistor switching circuit as shown in U.S. Pat. No. 3,898,552, issued Aug. 5, 1975.

In order to achieve increased isolation between control and power circuits, photovoltaic isolators have been used. A solid state relay utilizing an optical isolation technique is disclosed in U.S. Pat. No. 3,321,631, issued May 23, 1967. Since optical isolators could not supply sufficient power to drive the output transistor of a solid state power relay directly, relays using optical couplers exhibited a high switch drop. Transformer-oscillator drive circuits were developed to provide sufficient driving power, as disclosed in U.S. Pat. No. 3,710,231, issued Jan. 9, 1973. This resulted in a design choice between relays with a low switch voltage drop which utilized bulky transformers and relays with a high switch voltage drop which used optical couplers.

The availability of power field effect transistor (FET's) and optical isolators which develop sufficient voltage to turn on these FET's has provided means for improving solid state relay performance. U.S. Pat. No. 4,227,098, issued Oct. 7, 1980, describes a solid state relay which incorporates a power field effect transistor and photodiode optical coupler.

In various applications, different modes of operation are required from a solid state relay. U.S. Pat. No. 4,188,547, issued Feb. 12, 1980, disclosed a multi-mode control logic circuit for solid state relays with provisions for normally open, normally closed, and latched operation in a single circuit. A particular operating mode was selected by connecting a separate mode terminal to line voltage or ground or by leaving the mode terminal unconnected.

SUMMARY OF THE INVENTION

In accordance with the present invention, a solid state relay is provided with a control logic circuit which receives a low level input control signal and controls a power field effect transistor switching element by means of an optical isolator. The control logic circuit allows for a plurality of operational modes in a single circuit, including operation as a normally open relay, a normally closed relay, or a latched relay. A high degree of isolation is provided between the input control and power circuits by the optical isolator, while the power field effect transistor switch element provides for a low switch voltage drop.

The control logic circuit includes a voltage regulator, control input circuit, filter circuit, latching circuit and optical isolator driving circuit. Application of a positive control signal or a grounding signal to designated terminals in the control input circuit causes a change in the logic level of an exclusive OR gate output from a logic high to a logic low. This logic signal passes through a resistor-capacitor time delay network which prevents noise from actuating the relay.

Then the signal passes to a second exclusive OR gate which is provided with positive feedback to provide a clean signal to the latching circuit. The latching circuit includes a flip-flop to provide the latching feature and two additional exclusive OR gates which amplify and invert the logic level control signal. The relay power supply can be connected to the flip-flop reset terminal to disable the latching feature.

The control signal passes from the latching circuit to an optical coupler driving circuit which includes transistor switches for driving light emitting diodes (LED's) in the optical coupler circuit. Each LED is contained in an optical coupler that includes an array of photovoltaic diodes which generates voltage in response to radiation from the LED's. This generated voltage is impressed on the gate of a power field effect transistor, thereby turning it on to provide the relay contact closure function. If the latching feature was not disabled, the FET will remain in the on condition even after the control input signal is removed.

The relay contact opening function is provided in a similar manner, except that the LED is turned off, thereby turning off the power FET. Thus a relay in accordance with this invention exhibits a low switch voltage drop and is capable of normally open, normally closed, or latched operation without the need for an additional connection to an external mode terminal.

DESCRIPTION OF THE PREFERRED EMBODIMENT

Figure 1:
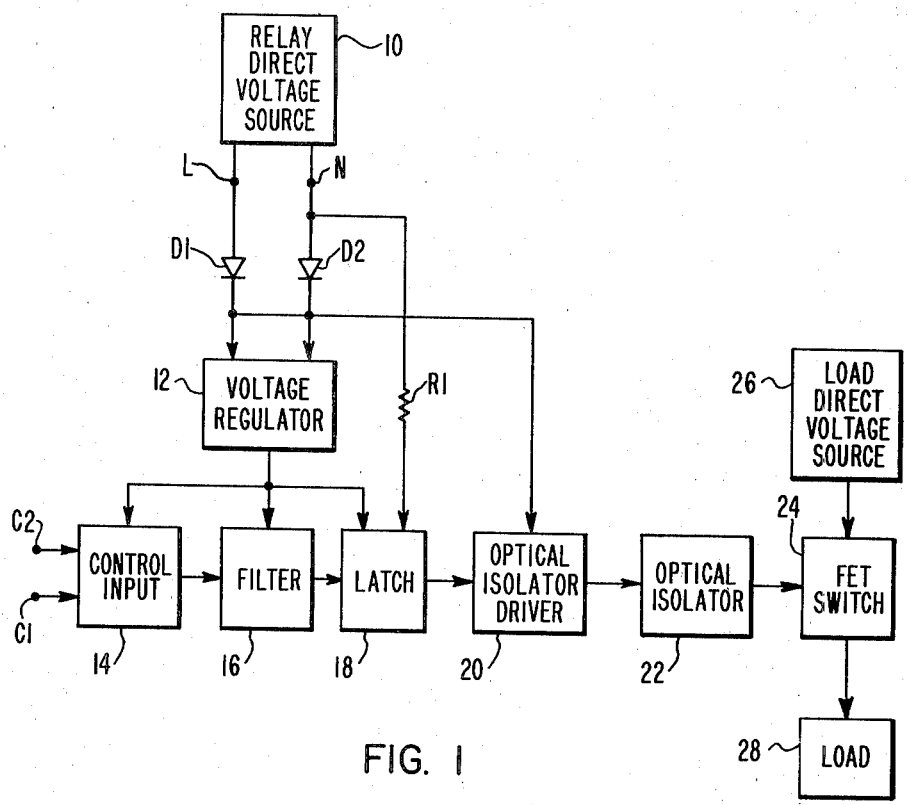
FIG. 1 is a functional block diagram showing the components of a solid state relay in accordance with an embodiment of the present invention.

Referring to the drawings, FIG. 1 shows a functional block diagram of a solid state relay in accordance with the present invention. Relay direct voltage source 10 is connected to functional terminals L or N. Connection to functional terminal L will cause the relay to operate in the latched mode, while connection to functional terminal N results in unlatched operation. Diodes D1 and D2 are connected between functional terminals L and N and voltage regulator 12 to provide power to the relay from the relay direct voltage source 10.

Voltage regulator 12 provides a stable supply voltage to the relay control input 14, filter 16 and latch 18 circuits. Two input terminals C1 and C2 are located on control input circuit 14 to illustrate that the relay can respond to a grounding signal or a positive voltage control signal. In this embodiment, grounding terminal C2 or applying a positive voltage to terminal C1 causes control input circuit 14 to change logic states from a high to a low. This causes a logic signal to pass through filter circuit 16 to latch circuit 18. If direct voltage source 10 is connected to functional terminal L, latch circuit 18 will shift to a particular logic state and supply a fixed signal to optical isolator driving circuit 20, thereby causing the optical isolators of isolator circuit 22 to remain in a fixed state, thus providing for latched relay operation. If direct voltage source 10 is connected to functional terminal N, a voltage signal supplied through resistor R1 provides means for overriding the latch circuit 18 so that no latching occurs and the signal supplied to optical isolator driving circuit 20 will change when the input control signal on terminal C1 or C2 changes. This provides unlatched relay operation.

Field effect transistor switch circuit 24 responds to radiation produced by optical isolator circuit 22 by providing either a low or a high resistance path between load direct voltage source 26 and load 28, thereby simulating the on and off functions of a mechanical relay.

Figure 2:
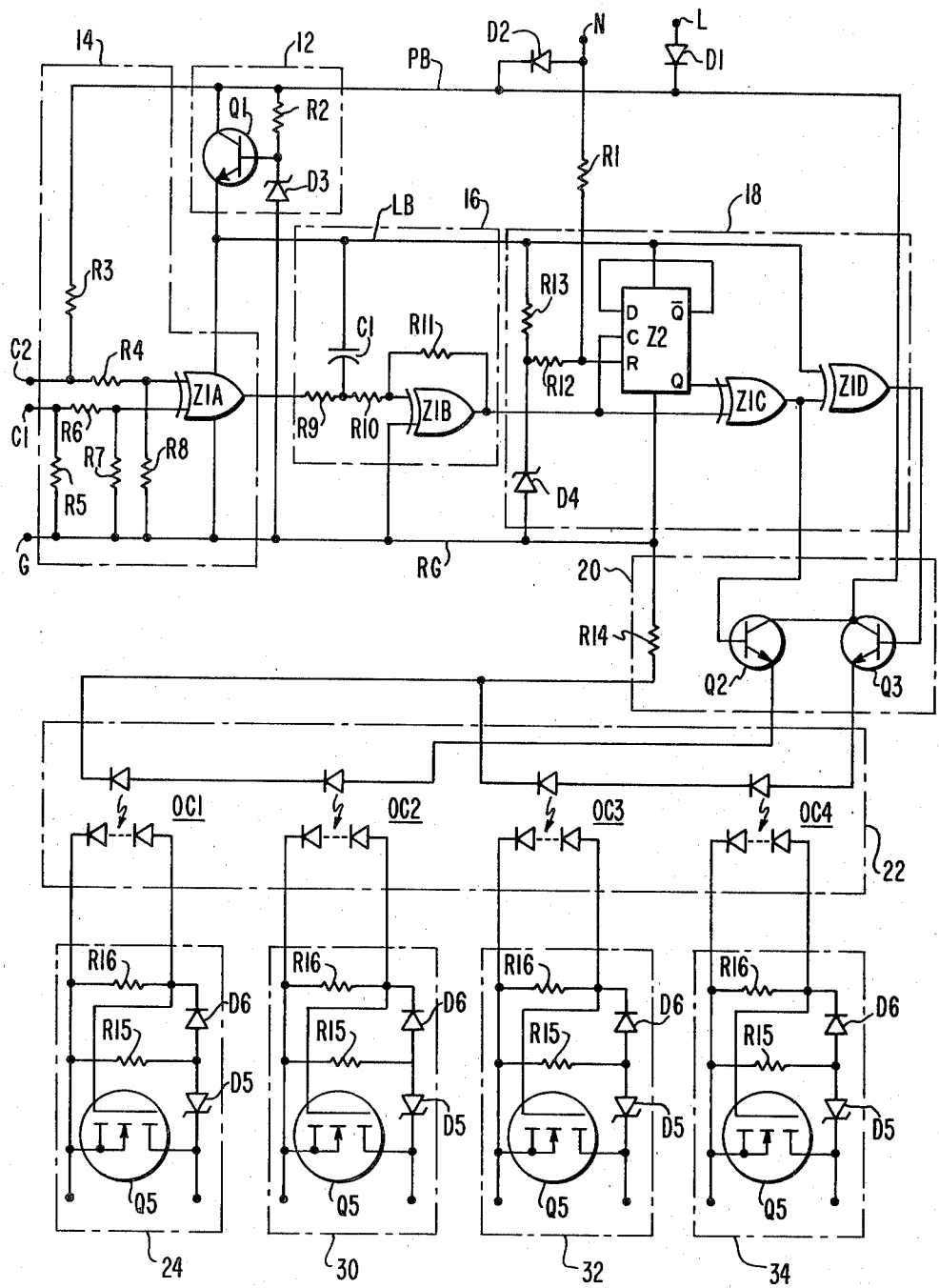
FIG. 2 is a schematic diagram of a solid state relay in accordance with an embodiment of the present invention.

Referring to FIG. 2, a circuit schematic is shown of a solid state relay in accordance with one embodiment of the present invention. A relay direct voltage source, not shown, is used to energize the solid state relay by supplying voltage to functional terminal L or N. Terminals L and N are connected to power bus PB through diodes D1 and D2 respectively. Voltage regulator circuit 12, comprising resistor R2, transistor Q2, and zener diode D3, is connected between power bus PB and relay ground RG and provides a regulated voltage to logic bus LB.

Control input circuit 14 comprises resistors R3, R4, R5, R6, R7, and R8 and exclusive OR logic gate Z1A. This control input circuit 14 acts as a sensing means to respond to a grounding control signal between terminals C2 and G or a positive voltage control signal between terminals C1 and G. It responds by changing the output of logic gate Z1A from a logic high to a logic low. This logic signal passes to filter circuit 16 which comprises resistors R9, R10, and R11, capacitor C1 and exclusive OR gate Z1B. The filter circuit provides a time delay and prevents noise from actuating the relay. In addition, resistor R11 connected between an input and output terminal on XOR gate Z1B provides positive feedback to provide a clean logic signal to the latch circuit 18.

Latch circuit 18 comprises resistors R12 and R13, zener diode D4, flip-flop circuit Z2, and logic gates Z1C and Z1D. The logic signal from filter circuit 16 is connected to one input of logic gate Z1C and also to the clock input C of flip-flop circuit Z2. Output terminal Q of flip-flop Z2 is connected to a second input of logic gate Z1C.

If the relay direct voltage source, not shown, is connected to functional terminal L, then reset terminal R on flip-flop Z2 is maintained at a low level and flip-flop Z2 serves as means for generating a logic signal which changes state in response to the change in control logic signal from a logic low to a logic high at the output of filter circuit 16. If the relay direct voltage source is connected to functional terminal N, reset terminal R on flip-flop Z2 receives a high signal, continually resetting flip-flop Z2. This continual resetting acts as means for overriding the latching function of flip-flop Z2.

Logic gate Z1D acts as an inverter to provide a logic signal complementary to the output of logic gate Z1C. The logic signals on the output of gates Z1C and Z1D are connected to optical isolator driver circuit 20 which comprises switching transistors Q2 and Q3 and resistor R14. The emitters of these transistors are connected in series with light emitting diodes in optical coupler circuit 22. A positive logic signal supplied to the base of transistor Q2 will turn on transistor Q2, thereby turning on the light emitting diodes of optical couplers OC1 and OC2. Similarly, a positive logic signal supplied to the base of transistor Q3 will turn on transistor Q3, thereby turning on the light emitting diodes of optical couplers OC3 and OC4.

The light emitting diodes of optical couplers OC1, OC2, OC3, and OC4 are used to generate radiation which is transmitted to an array of photodiodes in each optical coupler. Each array of photodiodes typically comprises the series connection of thirty-two photodiodes. Radiation causes each photodiode array to generate a voltage to turn on a field effect transistor.

Each field effect transistor switching circuit 24, 30, 32, and 34 comprises resistors R15 and R16, zener diode D5, diode D6 and field effect transistor Q5. The field effect transistors Q5, each contain a gate, drain, source and substrate electrode. A pair of output terminals are connected to the source and drain terminals of each field effect transistor. Resistor R16 is connected between the gate and substrate electrodes to provide means for draining the charge on the FET gate, thereby causing the FET to turn off. If the circuit in FIG. 2 receives power at terminal N, grounding terminal C2 or supplying a positive signal to terminal C1 will actuate the relay stopping current flow in optical couplers OC1 and OC2 and causing current to flow in optical couplers OC3 and OC4. This turns off FET switching circuits 24 and 30 and turns on circuits 32 and 34. Removing the control signal causes circuits 24 and 30 to turn on while circuits 32 and 34 turn off. Therefore the terminals of circuits 24 and 30 represent normally closed contacts, while the terminals of circuits 32 and 34 represent normally open contacts.

If power is applied to the relay at terminal L, flip-flop Z2 changes state each time the control signal is removed, causing both inputs of gate Z1C to change at the same time. Therefore the output of gate Z1C does not change and the relay stays latched.

Each FET switching circuit 24, 30, 32 and 34 is provided with a transient protection circuit which clamps inductive voltage spikes to protect FET Q5. If a voltage spike appears on the output terminals of an FET switching circuit, Zener diode D5 will clamp the spike at 82 volts and pass current to the associated optical coupler diode array. This creates a gate voltage which turns on the FET and clamps the voltage spike to less than 90 volts. Diode D6 prevents the forward biasing of diode D5 when the FET is turned on during normal operation. Resistor R15 provides a path for leakage current through diode D7 to ensure that FET Q5 is not unintentionally switched on.

The following table of components is provided as a more complete exemplary embodiment of the invention in connection with the circuitry illustrated in FIG. 2.

| TABLE OF COMPONENTS | |
|---|---|
| INTEGRATED CIRCUITS | |
| Z1 | MC14070 BAL |
| Z2 | MC14013 BAL |
| RESISTORS | |
| R1 | 20K |
| R2 | 5.6K |
| R3 | 10K |
| R4 | 160K |
| R5 | 10K |
| R6 | 160K |
| R7 | 200K |
| R8 | 200K |
| R9 | 20K |
| R10 | 100K |
| R11 | 470K |
| R12 | 10K |
| R13 | 100K |
| R14 | 620Ω |
| R15 | 10K |
| R16 | 4.3 Meg |
| CAPACITORS | |
| C1 | 1 μf |

-continued

TABLE OF COMPONENTS

DIODES
| | |
|---|---|
| D1 | 1N914 |
| D2 | 1N914 |
| D3 | 10V Zener |
| D4 | 3.3V Zener |
| D5 | 82V Zener |
| D6 | 1N914 |

TRANSISTORS
| | |
|---|---|
| Q1 | 2N2222A |
| Q2 | 2N2222A |
| Q3 | 2N2222A |
| Q4 | 2N2222A |
| Q5 | IRF530 |

OPTICAL COUPLERS
| | |
|---|---|
| OC1 | DIG-2 |
| OC2 | DIG-2 |
| OC3 | DIG-2 |
| OC4 | DIG-2 |

Using the component values listed in the table, a circuit was constructed meeting the following specifications:

| | |
|---|---|
| Control Current | 20 ma maximum |
| Switch Drop at 1.0 amp | 0.3 Vdc Maximum |
| Efficiency | 97.9% |

While a preferred embodiment of this invention has been described, the specific circuitry employed may be varied in relation to particular applications without departing from the scope of the invention.

What is claimed is:

1. A solid state relay comprising:
   sensing means for responding to an input voltage signal by producing a logic signal of a relatively fixed magnitude;
   a logic gate having a first input terminal operatively connected to receive said logic signal from said sensing means, an output terminal, and a second input terminal;
   said second input terminal having a fixed interconnection to means for generating a first signal changing in logic state only upon a predetermined change in the waveform of said logic signal from said sensing means;
   means for selectively overriding said first signal connected to said second input terminal;
   a light emitting diode responsive to said logic first signal appearing at said output terminal for generating radiation;
   an array of photodiodes connected in series between a pair of array electrodes and operatively coupled to said light emitting diode for developing a control voltage across said array electrodes in response to radiation from said light emitting diode;
   a field effect transistor including a pair of current carrying electrodes, a gate electrode and a substrate electrode, one of said array electrodes connected to said gate electrode and the other of said array electrodes connected to said substrate electrode whereby the impedance between said current carrying electrodes has one value in the absence of and a greatly different value in the presence of said control voltage between said gate electrode and said substrate electrode;
   means for providing a large resistive impedance between said gate electrode and said substrate electrode;
   and
   a pair of output terminals, each connected to a respective one of said current carrying electrodes.

2. A solid state relay as recited in claim 1, wherein said means for generating said first signal comprises a flip-flop circuit operatively connected to receive said logic signal.

3. A solid state relay as recited in claim 2, wherein said means for selectively overriding said first signal includes a reset input on said flip-flop circuit.

4. A solid state relay as recited in claim 1 wherein the connection of a direct voltage to said means for selectively overriding said first signal provides unlatched operation of said relay.

5. A solid state relay as recited in claim 1, further comprising means for filtering said logic signal, connected between said sensing means and said logic gate.

6. A solid state relay as recited in claim 5, wherein said means for filtering comprises:
   a second logic gate having an input connection and an output connection;
   two resistors connected in series with said input connection;
   a capacitor connected to the common point between said two resistors;
   said logic signal being connected to said series connection of said two resistors; and
   having a third resistor connected between said input connection and said output connection of said second logic gate.

7. A solid state relay as recited in claim 1 further comprising means for suppressing voltage spikes on said current carrying electrodes.

8. A solid state relay as recited in claim 7 wherein said means for suppressing voltage spikes comprises:
   a circuit branch connected between said gate electrode and one of said current carrying electrodes;
   said circuit branch including the series connection of a diode and a zener diode; and
   a resistor having one end connected to the common point between said diodes and a second end connected to the other current carrying electrode.

* * * * *